United States Patent [19]

Shou et al.

[11] Patent Number: 5,434,529
[45] Date of Patent: Jul. 18, 1995

[54] SIGNAL INTEGRATION CIRCUIT

[75] Inventors: Gouliang Shou; Sunao Takatori; Makoto Yamamoto, all of Tokyo, Japan

[73] Assignee: Yozan Inc., Tokyo, Japan

[21] Appl. No.: 142,939

[22] Filed: Oct. 29, 1993

[51] Int. Cl.⁶ .......................... H03K 17/687
[52] U.S. Cl. ..................... 327/436; 327/124; 327/336
[58] Field of Search .............. 328/127; 307/585, 491, 307/490, 520, 246; 327/336, 437, 124, 172, 427, 436

[56] References Cited

U.S. PATENT DOCUMENTS

| | | | |
|---|---|---|---|
| 3,058,013 | 10/1962 | Acker | 307/228 |
| 3,073,966 | 1/1963 | Chrzanowski et al. | 307/251 |
| 3,296,547 | 1/1967 | Sickles, II | 330/277 |
| 3,564,989 | 3/1971 | Millword | 328/127 |
| 4,481,434 | 11/1984 | Janutka | 307/246 |
| 4,903,226 | 2/1990 | Tsividis | 364/807 |
| 5,136,264 | 8/1992 | Nardozza | 332/102 |
| 5,148,047 | 9/1992 | Spohrer | 307/246 |
| 5,166,540 | 11/1992 | Park | 307/490 |
| 5,331,222 | 7/1994 | Lin et al. | 307/490 |

FOREIGN PATENT DOCUMENTS 8900739  1/1989  WIPO .

OTHER PUBLICATIONS

Patent Abstracts of Japan, vol. 13, No. 201, 12 May 1989, "Signal Transmitting System".
Soviet Inventions Illustrated, Section EI, Week 8548, 23 May 1985, Derwent Publications Ltd.
Patent Abstracts of Japan, vol. 4, No. 67, 20 May 1980, "Time Division Multiplex Transmitting Device".

*Primary Examiner*—Timothy P. Callahan
*Assistant Examiner*—My. Trang Nu Ton
*Attorney, Agent, or Firm*—Cushman, Darby & Cushman

[57] ABSTRACT

A signal integration circuit having a first MOSFET including a drain connected to a power source and a gate connected to a plural number of the first capacitances in parallel; and an input means connected to each capacitance; in which each input means comprises; the second MOSFET whose source is connected to the first capacitance through a resistance, which receives an input pulse signal, and whose gate is grounded through the second capacitance, and the third MOSFET whose source is connected to a gate of the second MOSFET, whose drain is connected to a power source, and whose gate receives a pulse signal for setting weight; a gate of the first MOSFET receiving a reference saw-tooth signal, a source of the first MOSFET grounded through the third capacitance, and an output pulse signal being output from this source of said first MOSFET.

3 Claims, 2 Drawing Sheets

SIGNAL INTEGRATION CIRCUIT

FIELD OF THE INVENTION

The present invention relates to a signal integration circuit effective for performing a weighted integration of signals.

BACKGROUND OF THE INVENTION

Conventionally, it has been necessary in a device comprising a plurality of inputs to integrate signals. Integrating signals is also necessary in a device with a plurality inputs and when different types of devices or libraries corresponding to the inputs are provided. Generally a multiplication circuit has been used for weighting and integrating each signal. As a result, the structure of the circuit has been complex.

SUMMARY OF THE INVENTION

The present invention solves the above problems with conventional devices and provides a signal integration circuit for integrating weighted signals using a simple circuit.

A signal integration circuit according to the present invention controls the threshold of a MOSFET by a voltage integrated by giving an electrical charge to parallel-connected capacitance, and generates an output pulse signal by eliminating a reference saw-tooth signal with the threshold. Each capacitor in the parallel-connected capacitance is charged by connecting the power source comprising the predetermined voltage to the capacitance in synchronism with the input pulse signal.

BRIEF DESCRIPTION OF THE DRAWINGS

FIG. 3($b$) shows a graph of the relationship between the reference saw-tooth wave form and the threshold voltage;

FIG. 3($c$) shows a graph of the relationship between the reference saw-tooth wave form and an output pulse signal; and FIG. 3($d$) is a graph illustrating the weight settling pulse signal $W_i$.

PREFERRED EMBODIMENT OF THE PRESENT INVENTION

Hereinafter an embodiment of the signal integration circuit according to the present invention is described with reference to the attached drawings.

Figure 1:
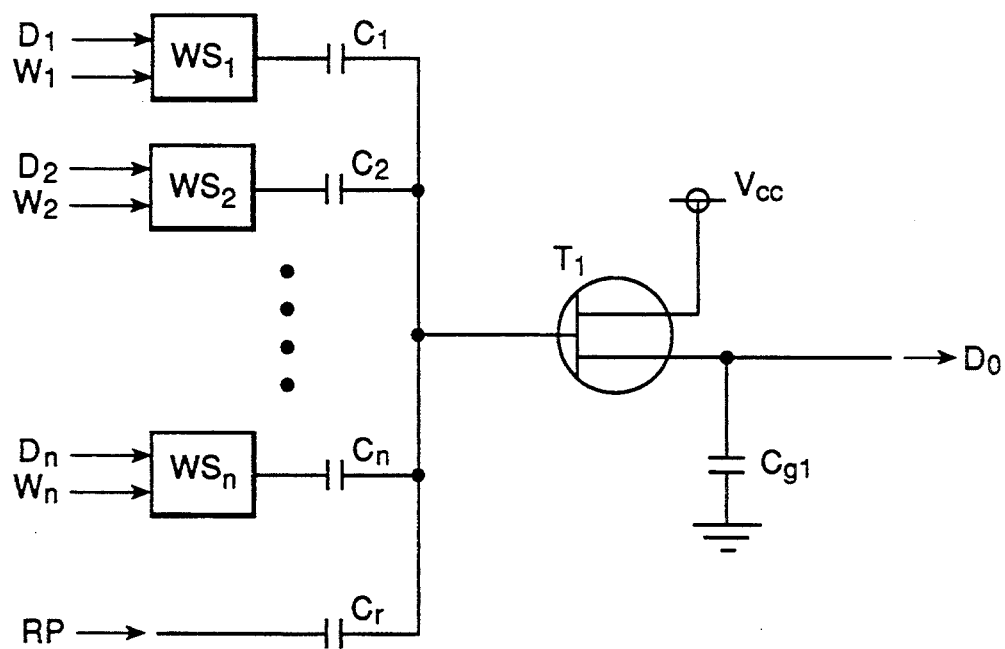
FIG. 1 is a circuit diagram of an embodiment of a signal integration circuit according to the present invention.

In FIG. 1, the signal integration circuit connects a plural number of input modules WS1, WS2, ..., WSn to MOSFET ("T1", hereinafter) through parallel-connected capacitances C1, C2, ..., Cn. The drain of T1 is connected to input power source Vcc. The source of T1 is grounded through capacitance Cg1. Voltage Do is generated at the source of T1 according to the voltage at the gate thereof.

The reference saw-tooth signal "RP" is input to the gate of T1 through capacitance "Cr". The voltage at the gate of T1 corresponds to the summation of the electrical charge from C1 to Cn and Cr. Here, the threshold voltage 30 is assumed to be 0 V and RP is a saw-tooth wave form 32 with a negative minimum value and a maximum value of 0 V as shown in FIG. 3($b$). When the voltage at the gate is raised by capacitances C1 to Cn, the effect is that the threshold for RP becomes lower. This effect is shown in FIG. 3($b$) with broken line Vt. T1 becomes conductive in the part of reference voltage 32 that is greater than Vt. As a result, the output of T1 becomes the output pulse signal Do illustrates in FIG. 3($c$).

Figure 2:
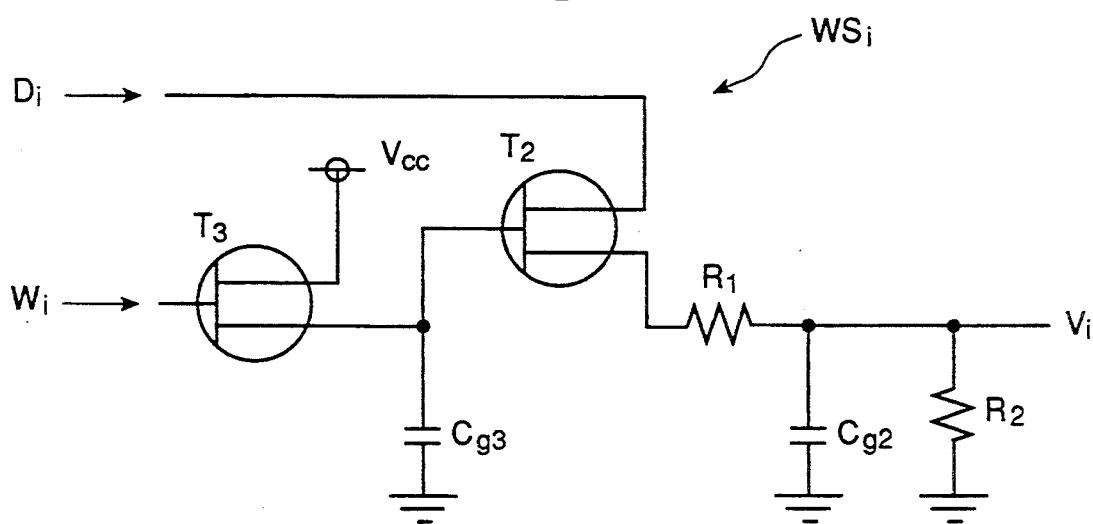
FIG. 2 is a circuit diagram of an input module of the embodiment in FIG. 1.
Figure 3A:
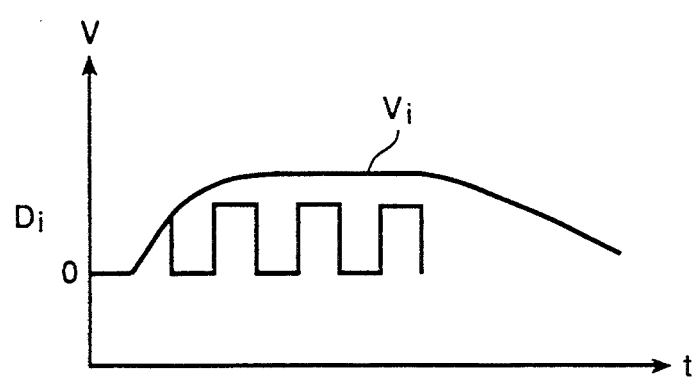
FIG. 3($a$) shows a graph of the relationship between input pulse signal and input module output.
Figure 3B:
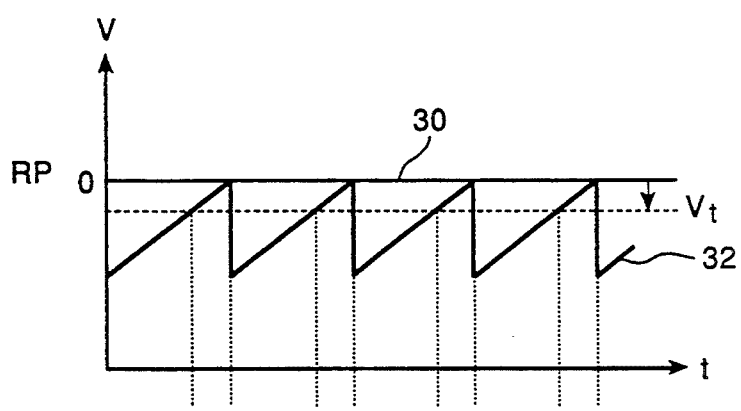
Figure 3C:
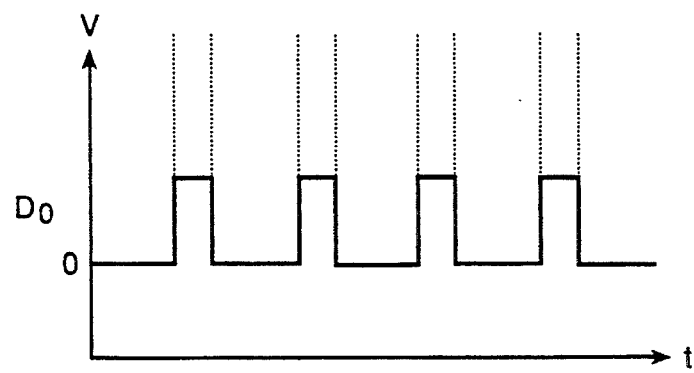
Figure 3D:
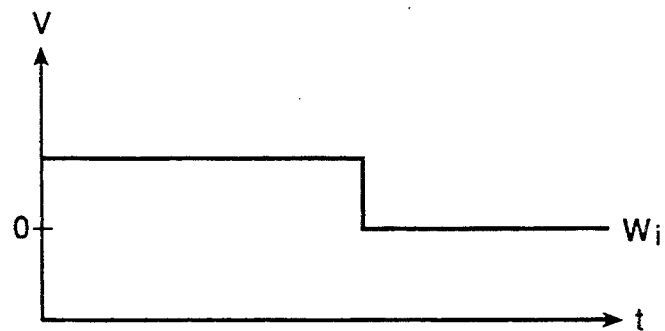

As shown in FIG. 2, in an input module WSi, input pulse signal Di is input to the drain of MOSFET T2, hereafter), and the source of T2 is an output terminal of capacitance Ci. The source of T2 is grounded through capacitance Cg2 and resistance R2 connected in parallel. By charging and discharging electricity of the predetermined time, voltage Vi is generated corresponding to Di. FIG. 3($a$) shows an example of the relationship between Di and Vi.

Capacitance Cg3, is connected to the gate of T2 for setting the gate voltage, to which MOSFET T3 is also connected for charging Cg3. A weight setting pulse signal Wi is input to the gate of T3. See FIG. 3($d$) Cg3 is charged by power source Vcc while the weight setting pulse is at a high level. Consequently, the voltage at the gate of T2 is settled. The voltage of the gate of T2 is equivalent to the weighting factor applied to input pulse signal Di. The speed for charging Cg2 becomes higher because the voltage between the source and the drain of T2 rises corresponding to the voltage of the gate, consequently, the maximum value of Vi rises. When the drain voltage of T2 is 0 V, electricity is discharged from the source to the drain. When the constant is appropriate, R2 is not necessary.

The above description shows that the signal integration circuit changes the voltage of the threshold of T1 according to the duty ratio of the weight input pulse signal Di, and controls the duty ratio of output pulse signal by it. Therefore, it is possible to output the result of weighted pulse input.

As mentioned, the signal integration circuit according to the present invention controls the threshold of MOSFET using voltages integrated by giving an electrical charge to a parallel-connected capacitance, generates an output pulse signal by eliminating a referential sawtooth wave form with the threshold. Each capacitance is charged by connecting the power source comprising the predetermined voltage to the capacitance synchronous to the input pulse signal. Therefore, it is possible to realize the integration of weighted signal using a rather simple circuit.

What is claimed is:

1. A signal integration circuit comprising:
    a power source;
    a first MOSFET including a drain connected to said power source, a source providing an output signal and a gate;
    a plurality of first capacitances connected at a common node, said gate of said first MOSFET being connected to said common node;
    a saw-tooth waveform signal generator providing a saw-tooth waveform signal to said gate of said first MOSFET through one of said plurality of first capacitances; and
    an plurality of input devices, wherein each input device is connected to said common node through a separate capacitance in said plurality of first capacitances, and wherein each input device comprises:
- a second MOSFET having a gate connected to ground, a drain which receives an input pulse signal and a source connected to one of said plurality of first capacitances,
- a resistance connected between said source of said second MOSFET and said one of said plurality of first capacitances, and
- a second capacitance provided between said gate of said second MOSFET and ground, and
- a third MOSFET having a source connected to said gate of said second MOSFET, a drain connected to said power source, and a gate that receives a weight setting pulse signal.

2. A signal integration circuit as defined in claim 1, wherein said each input device further comprises a second resistance and a third capacitance connected in parallel between said source of said second MOSFET and ground.

3. A signal integration circuit comprising:
- a power supply;
- a first transistor having a drain connected to said power supply, a source providing an output signal and a gate;
- a plurality of first capacitances connected in parallel at a common node, said gate of said first MOSFET being connected to said common node;
- a saw-tooth waveform signal generator providing a saw-tooth waveform signal to said gate of said first MOSFET through one of said plurality of first capacitances; and
- an plurality of input devices, wherein each input device is connected to a separate capacitance in said plurality of first capacitances and comprises:
  - a second transistor having a gate connected to ground, a drain which receives an input pulse signal and a source connected to one of said plurality of first capacitances,
  - a resistance connected between said source of said second transistor and said one of said plurality of first capacitances, and
  - a second capacitance provided between said gate of said second transistor and ground, and
  - a third transistor having a source connected to said gate of said second transistor, a drain connected to said power supply, and a gate that receives a weight setting pulse signal.

* * * * *